(12) United States Patent
Analui et al.

(10) Patent No.: US 6,778,017 B2
(45) Date of Patent: Aug. 17, 2004

(54) METHOD AND APPARATUS FOR A MULTI-POLE BANDWIDTH ENHANCEMENT TECHNIQUE FOR WIDEBAND AMPLIFICATION

(75) Inventors: Behnam Analui, Pasadena, CA (US); Seyed-Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 3 days.

(21) Appl. No.: 10/213,551

(22) Filed: Aug. 6, 2002

(65) Prior Publication Data

US 2003/0052739 A1 Mar. 20, 2003

Related U.S. Application Data

(60) Provisional application No. 60/310,311, filed on Aug. 6, 2001.

(51) Int. Cl.[7] .................................................. H03F 1/14
(52) U.S. Cl. ....................... 330/292; 330/302; 330/310
(58) Field of Search ................................. 330/292, 302, 330/310, 311

(56) References Cited

U.S. PATENT DOCUMENTS

| | | | | | |
|---|---|---|---|---|---|
| 5,250,912 A | * | 10/1993 | Fujita | ........................... | 330/285 |
| 5,745,857 A | * | 4/1998 | Maeng et al. | ................ | 330/310 |
| 5,889,434 A | * | 3/1999 | Shimura et al. | ............ | 330/302 |
| 5,990,748 A | | 11/1999 | Tomasini et al. | ........... | 330/292 |
| 6,218,904 B1 | | 4/2001 | Panther | ....................... | 330/296 |
| 6,489,862 B1 | * | 12/2002 | Frank | ......................... | 330/302 |

* cited by examiner

*Primary Examiner*—Khanh Van Nguyen
(74) *Attorney, Agent, or Firm*—Daniel L. Dawes; Myers Dawes Andras & Sherman LLP (57) ABSTRACT

The gain-bandwidth (GBW) limitation problem inherent in all amplifiers is overcome to provide wideband amplifiers with specified characteristics for the transfer function. Parasitic capacitances of transistors are absorbed or incorporated into the design of the passive networks, which are inserted between the gain stages of the amplifier. The component values are determined based on conventional low-pass filter structures. A prototype CMOS transimpedance amplifier implemented using the developed technique achieves over 9 GHz bandwidth and 54 dB transimpedance gain from a 0.5 pF photo-diode capacitance.

20 Claims, 10 Drawing Sheets

METHOD AND APPARATUS FOR A MULTI-POLE BANDWIDTH ENHANCEMENT TECHNIQUE FOR WIDEBAND AMPLIFICATION

RELATED APPLICATION

The present application is related to U.S. Provisional Patent Application serial no. 60/310,311, filed on Aug. 6, 2001, to which priority is claimed pursuant to 35 USC 119.

BACKGROUND OF THE INVENTION

1. Field of the Invention

The invention relates to field of high-speed, wideband amplifiers used in applications, such as fiber optic communications, ultra high-speed copper communications (e.g. Ethernet) and other broadband communication networks.

2. Description of the Prior Art

The ever-growing demand for higher information transfer rates has resulted in a rapid emergence of highly integrated communication systems. Silicon integrated circuits are the only candidate that can achieve the required level of integration with reasonable speed, cost, and yield and have thus been pursued to a great degree in recent years. In particular, full silicon-based integration of optical-fiber-based data communication systems, such as 10-GB/s (OC192) and 40-GB/s (OC768) SONET or Gigabit ethernet systems, can be of great interest for these reasons. Higher level of integration allowed by integrated circuit technologies (e.g. CMOS, SiGe HBT, etc.) is essential for a system on a chip (SOC) solution.

However, silicon-based integrated circuits implementing such systems face serious challenges due to the inferior parasitic characteristics in silicon-based technologies, complicating the procedure for a wide-band design. Wideband amplifiers are one of the most critical building blocks at the electro-optical interface on both receiver and transmitter sides. Wideband operation is an inseparable part of any baseband communication system such as non-return-to-zero (NRZ) amplitude shift keying (ASK), common to optical fiber communications, due to the signal's spectral content which ranges down to very low frequencies. Particularly, all amplifiers in the path should have enough bandwidth with minimum variations in the passband and with a constant group-delay to avoid distortion in the signal.

Figure 1:
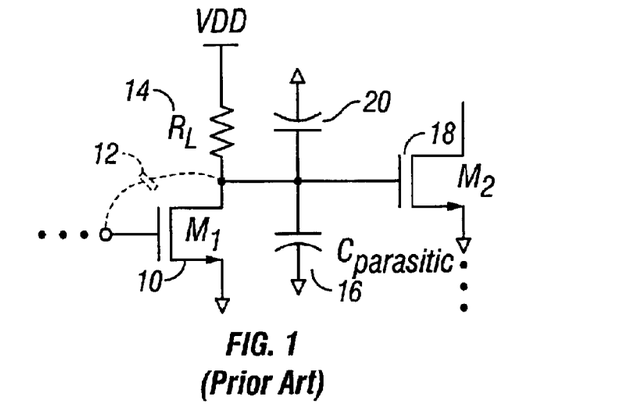
FIG. 1 is a schematic diagram of an example of an amplifier in which the parasitic capacitance of a transistor and its effect on bandwidth is illustrated.

In any high-speed wideband application, signal conditioning is a critical component of the signal path. Unfortunately, traditional integrated circuit design techniques suffer from limited bandwidth due to the RC-time constants of the circuit. For instance, the amplification stage schematically depicted in FIG. 1 is comprised of transistor 10 with an input Miller capacitance 12, a load resistance 14, $R_L$, an output transistor 18 and a node 20 between transistors 10 and 18 to which parasitic capacitance 16, $C_{parasitic}$, is coupled. The circuit of FIG. 1 has at least a pole with time constant of $\tau = R_L \cdot C_{Parasitic}$, where $C_{parasitic}$ is the total parasitic capacitance on node 20 due to various sources such as the drain capacitance of transistor 10 and gate capacitance of transistor 18. While this example is given for CMOS transistors, this limitation is quite general and independent of chosen technology.

The inherent parasitic capacitors of the transistors are the main cause of bandwidth limitation in wideband amplifiers. Several bandwidth enhancement methods have been proposed in the past. First order shunt peaking is used to introduce a resonant peaking at the output when the amplitude starts to roll off at high frequencies. Traditionally, it has been done by adding a series inductor with the output load that increases the effective load impedance as the capacitive reactance drops at higher frequencies. Capacitive peaking is another method that can improve the bandwidth. A more exotic approach to solving the problem was proposed by Ginzton et al using distributed amplification. Here, the gain stages are separated with transmission lines. Although the gain contributions of the several stages are added together, the parasitic capacitors can be absorbed into the transmission lines contributing to its real part of the characteristic impedance. Ideally, the number of stages can be increased indefinitely, achieving an unlimited gain bandwidth product. In practice, this will be limited by the loss of the transmission line. Hence, the design of distributed amplifiers requires careful electromagnetic simulations and very accurate modeling of transistor parasitics.

What is needed is some kind of way to minimize the bandwidth degradation due to the parasitic capacitors.

BRIEF SUMMARY OF THE INVENTION

This work introduces a new multi-pole bandwidth enhancement technique for wideband amplifier design. It is based on turning the entire amplifier into a low-pass filter with a well-defined pass-band characteristic and cut-off frequency. The inevitable parasitic capacitances of the transistors are absorbed as part of the low-pass filter structure(s) and hence, affect the bandwidth of the amplifier in a controlled fashion.

More formally, the invention can be understood to be an amplifier comprising a plurality of gain stages in which each of the gain stages has a parasitic capacitance associated therewith and which amplifier is characterized by a corresponding transfer function. At least one network is included which is coupled between two of the gain stages and/or input of the input gain stage and/or outputting of the output gain stage such that the parasitic capacitance associated with at least one of the gain stages is included as part of the network topology. The network's component values are chosen to provide an enhanced bandwidth as compared to the transfer function of the gain stage as limited by the parasitic capacitance associated therewith. More, generally the amplifier comprises a plurality of networks with a network being coupled between each of the gain stages, and input and output networks.

Normally, each gain stage has an input parasitic capacitance and an output parasitic capacitance and the network coupled between the gain stages incorporates the output parasitic capacitance of a leading one of the two gain stages into its circuit topology and incorporates the input parasitic capacitance of a following one of the two gain stages into its circuit topology. The network comprises a passive network or a low pass filter, or more specifically a third order ladder network. The invention is, however, not necessarily limited to a given type or class of network as long as the teachings of the invention are practiced in modifying the transfer function of the amplifier. Thus, it must be expressly understood that active circuits or filters, or many other types of passive filter designs may be used, which are equivalent to the spirit and sense of the invention to a passive low pass filter or even to third order ladder networks.

The amplifier can also be characterized by a gain bandwidth product and characterized in that the component values are chosen such that the gain bandwidth product of the amplifier is not subject to the Bode-Fano limit.

In the case where the network comprises a third order ladder network of Butterworth type, the two gain stages are characterized by an enhanced bandwidth ratio, BWER, given by $$BWER = \frac{\omega_{c,new}}{\omega_{c,old}} = \frac{1}{1-\delta} \frac{R_2}{R_1+R_2} \frac{C_1+C_3}{C_1} \text{ where } \delta = \sqrt[3]{\frac{R_1-R_2}{R_1+R_2}}$$

where $C_1$ is the output parasitic capacitance of the leading gain stage, $C_3$ is the input parasitic capacitance of the following gain stage, $R_1$ is the output resistance of the leading gain stage, and $R_2$ is the input resistance of the following gain stage.

Where the input stage is a transimpedance amplifier stage, then the input network is characterized by an enhanced bandwidth ratio, BWER, given by $$BWER = \frac{\omega_{c,new}}{\omega_{c,old}} = \frac{1}{1-\delta} \frac{R_2}{R_1} \frac{C_1+C_3}{C_1} \text{ where } \delta = \sqrt[3]{\frac{R_1-R_2}{R_1+R_2}}$$

where $C_1$ is the parasitic capacitance of the input source, $C_3$ is the input parasitic capacitance of the following gain stage, $R_1=2.05\ R_2$, and $R_2$ is the input resistance of the following gain stage.

The invention is further defined as a method of amplifying a signal comprising the steps of amplifying the signal in a plurality of gain stages in which each of the gain stages has a parasitic capacitance associated therewith and is characterized by a corresponding transfer function. The amplified signal is conditioned between the gain stages such that the parasitic capacitance associated with at least one of the gain stages is included as part of the overall transfer function of the gain stages with inserted networks to result in an enhanced bandwidth of the gain stages as compared to the gain stages as limited by the parasitic capacitance associated therewith without signal conditioning.

The step of conditioning the amplified signal between the gain stages is performed in a manner so that that the parasitic capacitance associated with all of the gain stages is included as part of the transfer function of the gain stages, which is implemented by conditioning the amplified signal between each of the gain stages with a corresponding network which incorporates the parasitic capacitances into its circuit topology, which in the illustrated embodiment is a passive network or a low pass filter. Specifically, in the illustrated embodiment the amplified signal is conditioned using a third order ladder network.

The invention can also be defined as a method of amplifying a signal in an amplifier of multiple gain stages having parasitic capacitances comprising the step of amplifying the signal in the amplifier which has been designed for optimized bandwidth performance as determined by amplifier parasitic capacitances and resistances without having any additional signal conditioning performed between gain stages of the amplifier. Then the signal between the gain stages of the amplifier is conditioned using a network with a determined inductance. A new cutoff frequency for the amplifier being determined to obtain a maximally flat frequency response when using the network coupled between the gain stages, which network incorporates the parasitic capacitances and resistances of the optimized amplifier into its circuit topology. The determined inductance required by the network is determined from the new cutoff frequency.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 2:
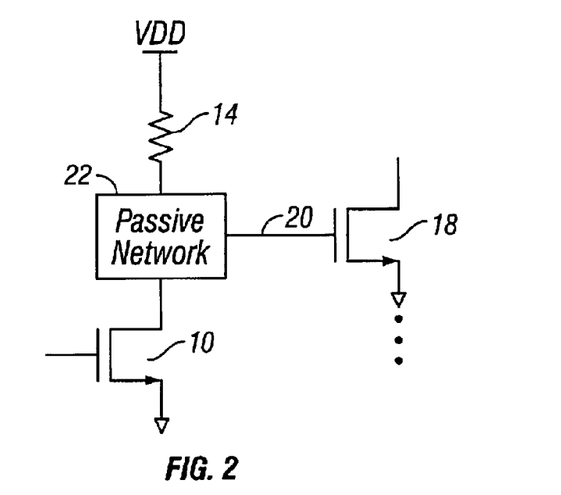
FIG. 2 is a block diagram which illustrates the strategy wherein a passive network is inserted in the gain stage of an amplifier to compensate for the effect of the transistor parasitic capacitance.

Noting that the parasitic capacitors responsible for bandwidth limitation are primarily due to the transistors in the amplifier, the invention is thus directed to a passive network to be inserted between the output and input of the all transistor gain stages to enhance the bandwidth by absorbing the capacitors into the passive structure 22 diagrammatically shown in FIG. 2. However, it is to be expressly understood that any gain stage having a characteristic of parasitic capacitance is within the scope of the invention whether the parasitic capacitance arises from transistors or some other source. The passive structure 22 can be considered to be a low pass filter. The design according to the invention will then result in a controlled impedance, active low pass filter, which is equivalent to a wideband amplifier with enhanced bandwidth. An example of one way of inserting a passive network 22 in one gain stage is shown diagrammatically in FIG. 2, where passive network 22 is coupled between load 14 and input transistor 10 with its output coupled to node 20 or the input to transistor 18.

Figure 3:
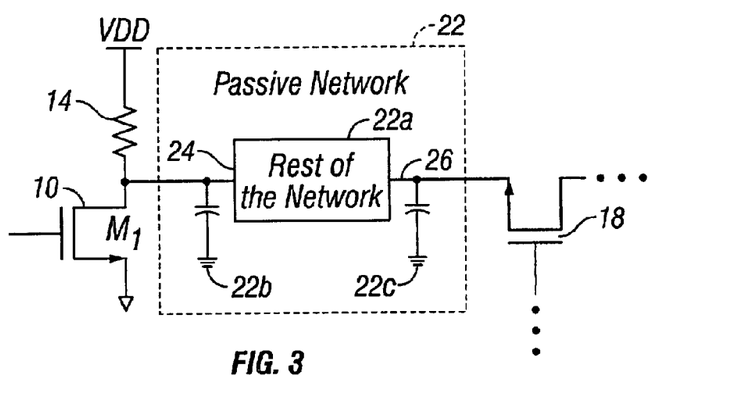
FIG. 3 is a block diagram which shows a passive network which has been designed in such a way that the parasitic capacitance at its input and/or output is part of its filter characteristics.

Passive network 22 can be designed in such a way that the parasitic capacitance at its input and/or output is part of its filter characteristics, as diagrammatically shown in FIG. 3. Passive network 22 is then thought of as a network circuit 22a having an input 24 coupled to parasitic input capacitance 22b and an output 26 with a parasitic output capacitance 22c. By doing so, passive networks 22 based on well known or new filter structures can be formed to provide a wider pass band characteristic with minimal controllable ripple.

Figure 9A:
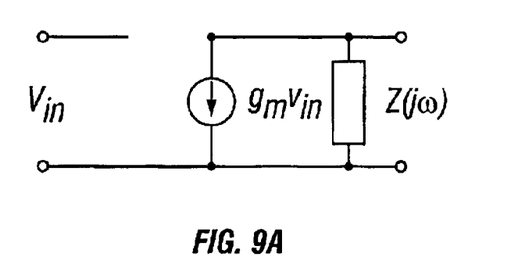
FIG. 9a is a schematic of a general small signal model of an amplifier with an arbitrary passive load and in FIG. 9b a three stage amplifier with isolation by cascaded passive networks.

However, before analyzing the illustrated embodiment consider some background information on bandwidth enhancement theory relevant to the invention. The limitation on the gain bandwidth product (GBW) of conventional amplifier structures has been known for over half a century. It was first studied in the context of broadband matching, where lossless passive networks are used to optimally match specific loads to source impedances over a wide range of frequencies. It is known that there exists a maximum gain bandwidth product for such a system regardless of the network used. The theory has been further generalized for a larger class of load impedances. The same theory can be applied to a simple single-stage amplifier, with the unilateral small signal model and a passive load impedance Z shown in FIG. 9a. For such an amplifier, it can be shown that the maximum gain bandwidth product is given by:

$$(GBW)_{max} = g_m/(\pi C) \tag{1}$$

where $g_m$ is the device transconductance and C is defined as:

$$C = \lim_{\omega \to \infty} \left( \frac{1}{j\omega Z} \right) \tag{2}$$

However, the upper-bound in (1) is not valid for amplifiers, where the load does not satisfy the conditions of an impedance function. In other words, if the overall transfer function of an amplifier is of the form:

$$A_v(j\omega) = g_m Z(j\omega) \tag{3}$$

and $Z(j\omega)$ is not an impedance function, then Bode-Fano limit in (1) need not be satisfied. Distributing passive structures 22 between gain stages can result in a transfer function of the form in equation (3) where $Z(j\omega)$ is not an impedance function. Therefore, the GBW product can potentially be higher.

It is also possible that the matching networks 22 can exist at the input and output of a single stage amplifier simultaneously. Although, this can result in larger GBW products than predicted by equation (1), the need for amplifier two-port parameters complicates the proposed design method. Moreover, the design is based on single stage, two-port amplifiers, which limits its applications.

Practical amplifiers are in fact more complicated than the model in FIG. 9a. They have several stages with more nodes controlling the transfer function shape. The new technique introduced by the invention, proposes deploying distributed passive networks 22 in between the gain stages of the cascaded amplifier to tailor the frequency response shape. The distribution of the passive networks 22 will result in a frequency dependent transfer function which need not be in form of an impedance function as in equation (3). Therefore, the Bode-Fano limit of equation (1) does not apply to the complete cascaded amplifier and can be overcome in practice.

Figure 9B:
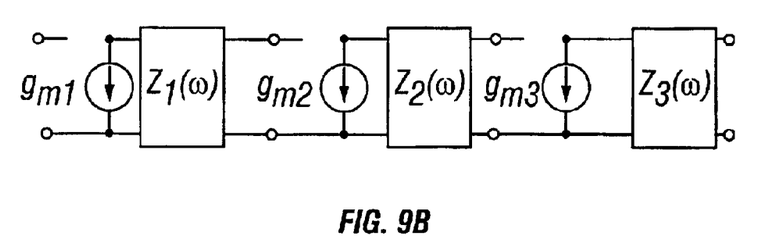

FIG. 9b shows small signal model of cascaded transistor gain stages and passive networks using unilateral approximation for the transistors. If some number of stages with the same simple model of FIG. 9a are placed in series, gain stages separate different networks due to the internal isolation of the active devices. Using the parameters in FIG. 9b, the over all transfer function can be written as:

$$A_v(j\omega) = G_m Z_{21}(j\omega) \tag{4}$$

where:

$$G_m = g_{m1} g_{m2} g_{m3} \tag{5}$$

$$Z_{21}(j\omega) = Z_{21,1}(j\omega) Z_{21,2}(j\omega) Z_{21,3}(j\omega) \tag{6}$$

and $Z_{21,i}(j\omega)$ are the forward impedance parameters of the two-port networks and can be designed independently. From equations (4) and (6) it is clear that it is the product of three different impedance functions and therefore need not be an impedance function itself. While $Z_{21}(j\omega)$ is still a rational function, the numerator polynomial can be more than one degree higher than the denominator. As a result, although equation (4) is in form of the overall gain in equation (3), it is not limited by the upper bound set by equation (1).

Figure 10:
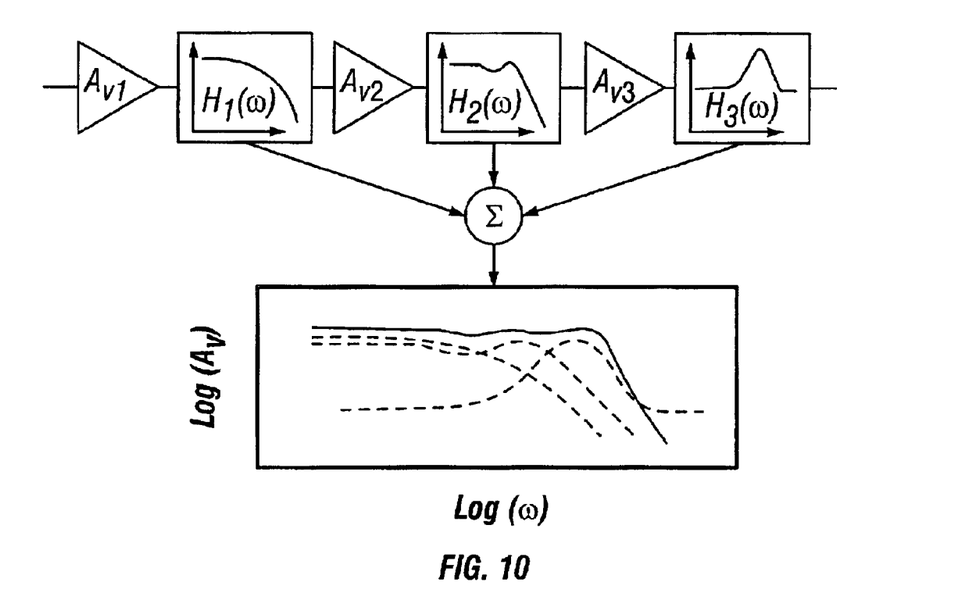
FIG. 10 is a block diagram of a staggered tuning arrangement for amplifiers and a graph of the resulting added outputs.

One design approach for such a cascaded transfer function is to stagger tune the frequency responses, such as the one shown symbolically in FIG. 10. An early amplitude roll-off due to a low frequency pole in one structure can then be compensated by a peaking in the next stage. Similarly, the overall phase response of passive structures 22 can be properly controlled. However, this requires careful calculation of exact transfer functions based on the component values that can be used as design equations. If not accurate, undesirable peaking may be introduced to the overall transfer function. In the design of such networks, well-known low-pass filter structures with known response characteristics can be used instead. Since, in the invention, it is desired to achieve a particular response shape, which resembles low-pass filter responses with known characteristics, the same component values as the ones in the filter can be used for the passive network elements. Therefore, the design procedure is much more simplified. Additionally, absorbing the capacitive parasitic components of the gain stages or transistors into the passive networks 22 will turn the transistor into a gain stage with infinite bandwidth. Thus, the frequency-dependent behavior will completely rely on the passive structures 22. In this approach one can resort to passive networks 22 with low sensitivity to component values.

Figure 4A:
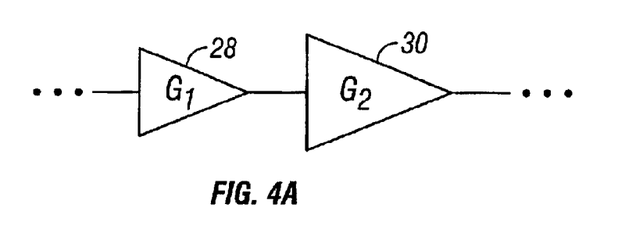
FIGS. 4a, 4b and 4c are schematic diagrams of a cascaded gain stages, a input and output stage respectively.
Figure 4B:
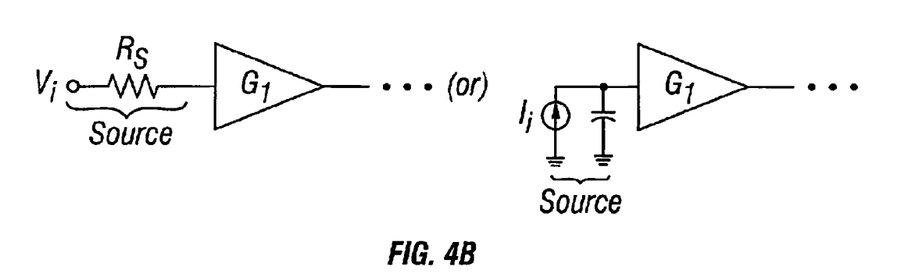
Figure 4C:
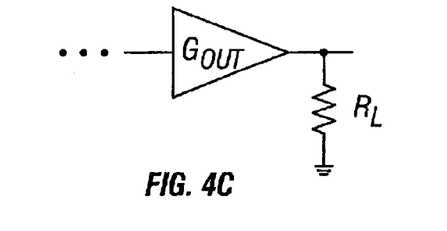
Figure 5A:
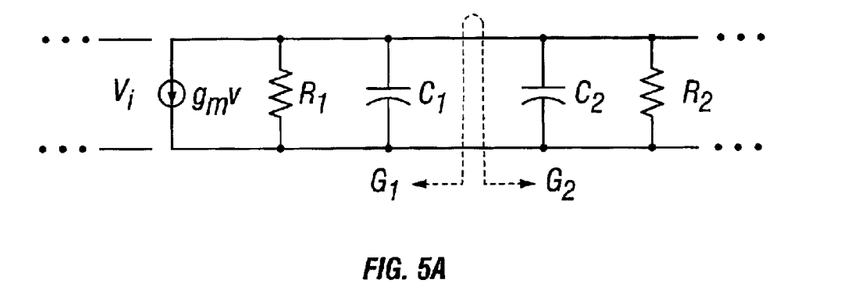
FIGS. 5a, 5b and 5c are schematics of the models of FIGS. 4a, 4b and 4c respectively for purposes of small signal analysis.
Figure 5B:
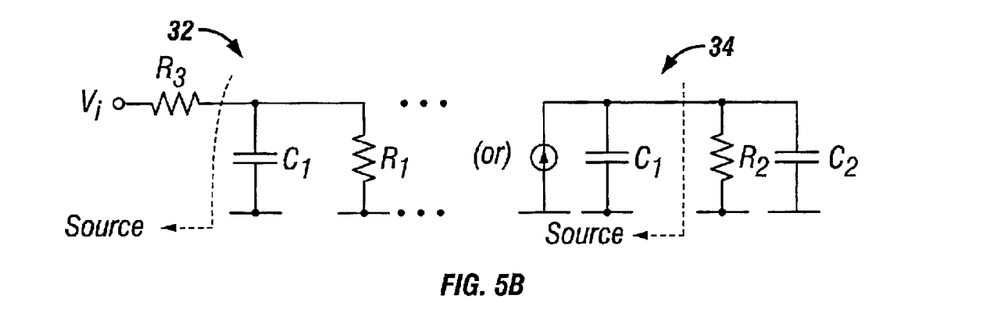
Figure 5C:
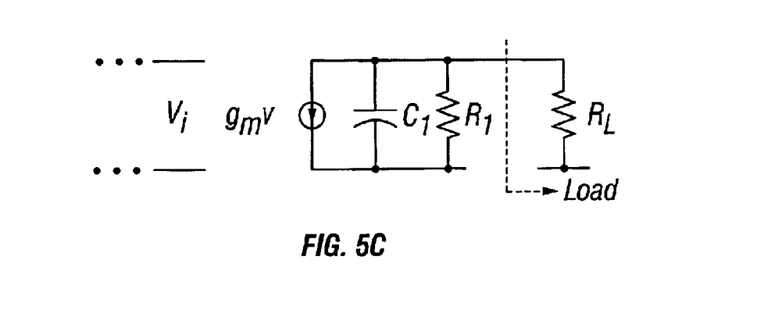

Cascaded gain stages 28 and 30 such as the one shown in the simple block diagram FIG. 4a can be modeled in small signal analysis as shown in FIG. 5a. Here $C_1$ is the equivalent capacitance on the output node of stage 28, $G_1$, and $C_2$, is the input capacitance of stage 30, $G_2$. Similarly, input stage 32 in FIG. 4b and output stage 34 in FIG. 4c can be modeled in small signal analysis as shown in FIGS. 5b and 5c respectively. Some of the component values in the models maybe zero depending up on the chosen technology, such as CMOS or SiGe HBT, etc. As can be clearly seen, in all the stages, due to the RC-time constants, the circuit behaves as a low-pass filter with gain greater than unity. The analysis here is based on inserting passive elements in the circuit, such that while the low-pass behavior is maintained, the cascaded section capacitors are isolated and absorbed in passive network 22 in order to modify this behavior.

Figure 6:
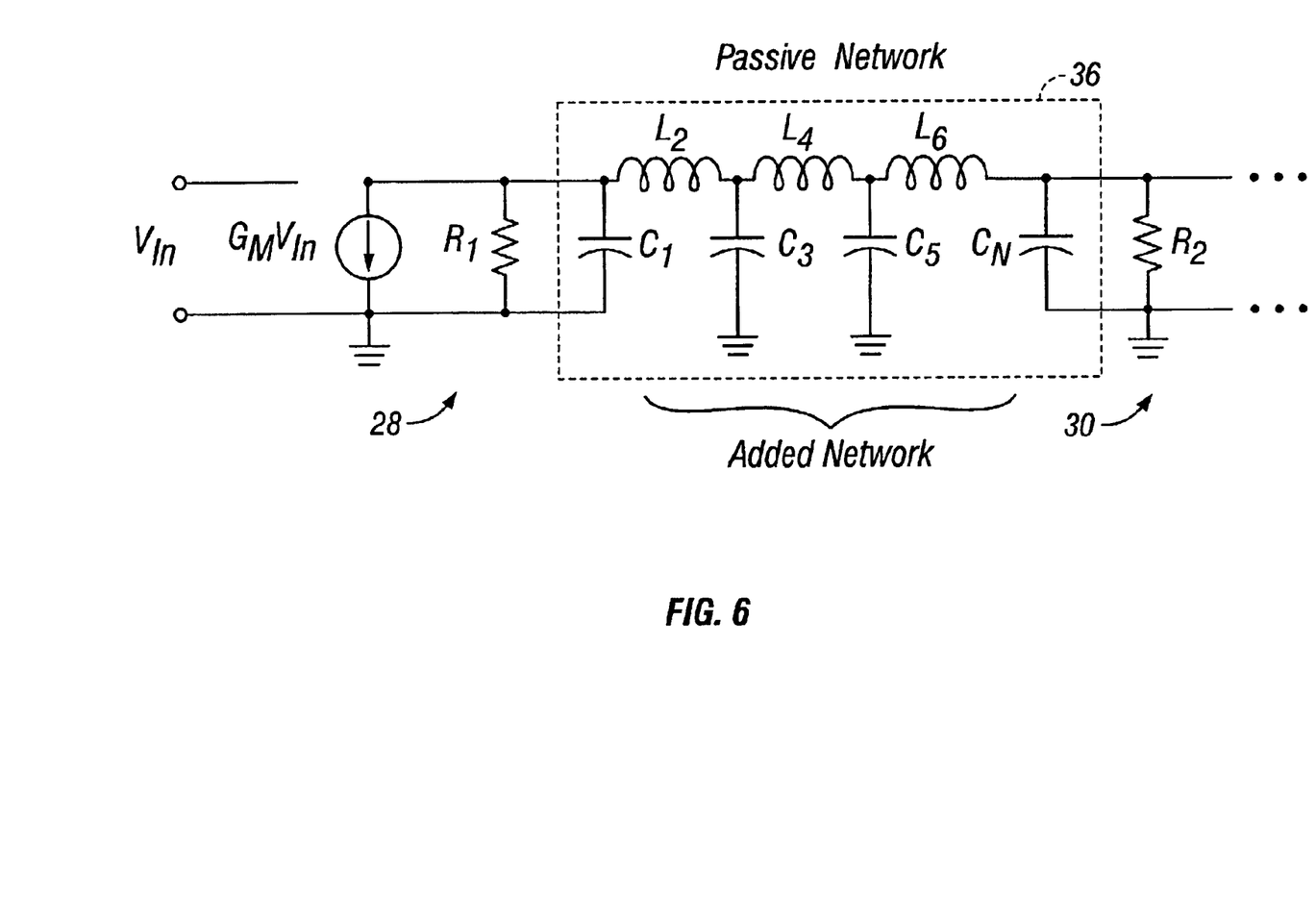
FIG. 6 is a small signal model schematic of a cascaded circuit with a ladder structure inserted between two stages, and is a simplified schematic of a transimpedance amplifier with parasitic capacitances and additional inductors.

To show an example of how this works, assume the small signal model of FIG. 4a, which is redrawn in FIG. 6. Here, a well-known ladder passive structure 36 is inserted between the two gain stages. To achieve a maximally flat low pass response or equally a flat wideband gain, the values for the elements of ladder structure 36 should be chosen from Butterworth relations, which are as follows:

$$C_1 = \frac{2\sin\gamma_1}{R_1(1-\delta)\omega_c}$$

$$C_{2m-1}L_{2m} = \frac{4\sin\gamma_{4m-3}\sin\gamma_{4m-1}}{(1-2\delta\cos\gamma_{4m-2}+\delta^2)\omega_c^2}$$

$$C_{2m+1}L_{2m} = \frac{4\sin\gamma_{4m-1}\sin\gamma_{4m+1}}{(1-2\delta\cos\gamma_{4m}+\delta^2)\omega_c^2}$$

$$\begin{cases} C_n = \dfrac{2\sin\gamma_1}{R_1(1+\delta)\omega_c} & \text{for } n \text{ odd} \\ L_n = \dfrac{2R_2\sin\gamma_1}{(1+\delta)\omega_c} & \text{for } n \text{ even} \end{cases}$$

Where:

$$\gamma_m = \frac{m\pi}{2n}$$

$$\delta = \sqrt[n]{\frac{R_1 - R_2}{R_1 + R_2}}$$

"n" is the order of the ladder structure, $\omega_c$ is the new 3 dB frequency of the low-pass behavior, $R_1$ and $R_2$ are the output resistance of first gain stage and input resistance of next gain stage respectively. Note that $C_1$ and $C_n$ are the parasitic capacitances absorbed into passive structure 36. Also for intermediate stages "n" is usually an odd number, but for the output stage it can be even too. In the analysis, $R_2$ should be replaced with $R_L$ which is the load resistance if the passive structure 36 is inserted between output stage and the load. The analysis for input stage is a little different and is discussed below.

If we define the bandwidth enhancement coefficient as the ratio between the old and new 3 dB frequency of the stage, we have the following equation:

$$BWER \equiv \frac{\omega_{c_{new}}}{\omega_{c_{old}}} = \frac{2\sin\gamma_1}{1-\delta} \frac{R_2}{R_2 + R_1}$$

Figure 7:
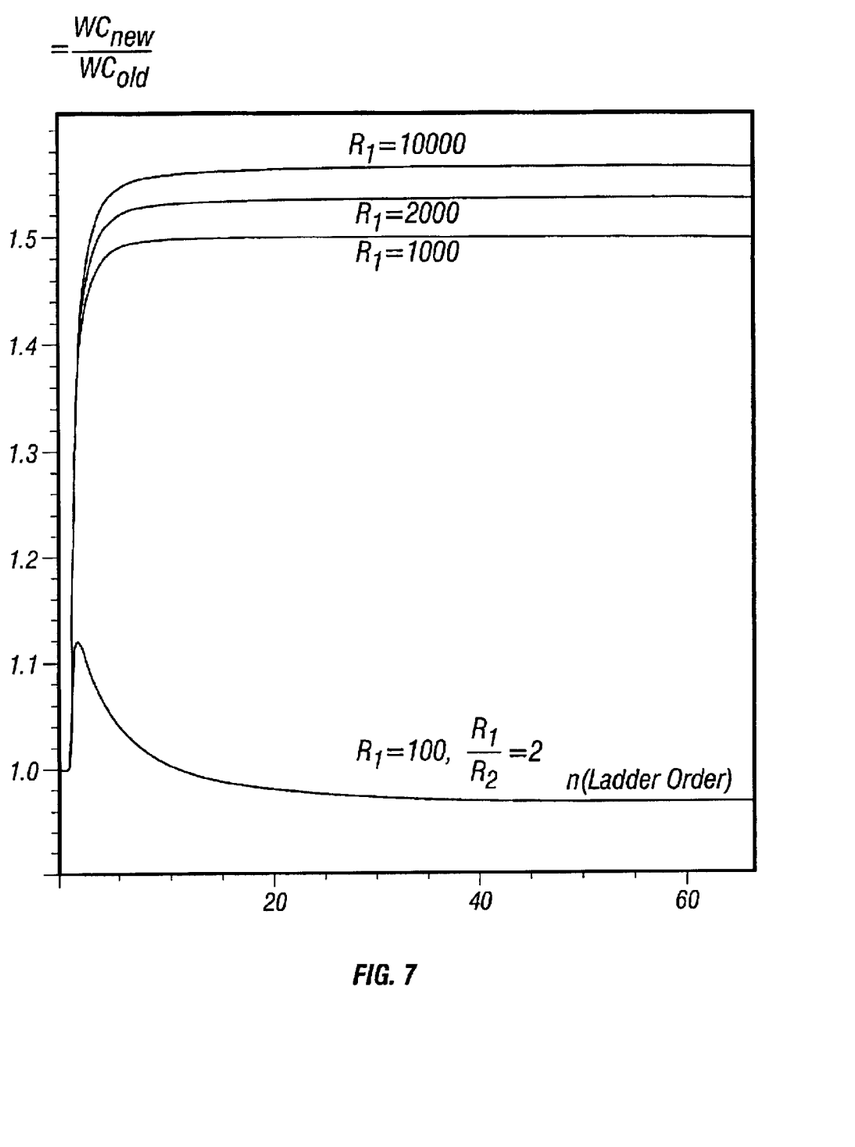
FIG. 7 is a graph of the enhancement coefficient according to the invention as a function of ladder order, n.
Figure 8:
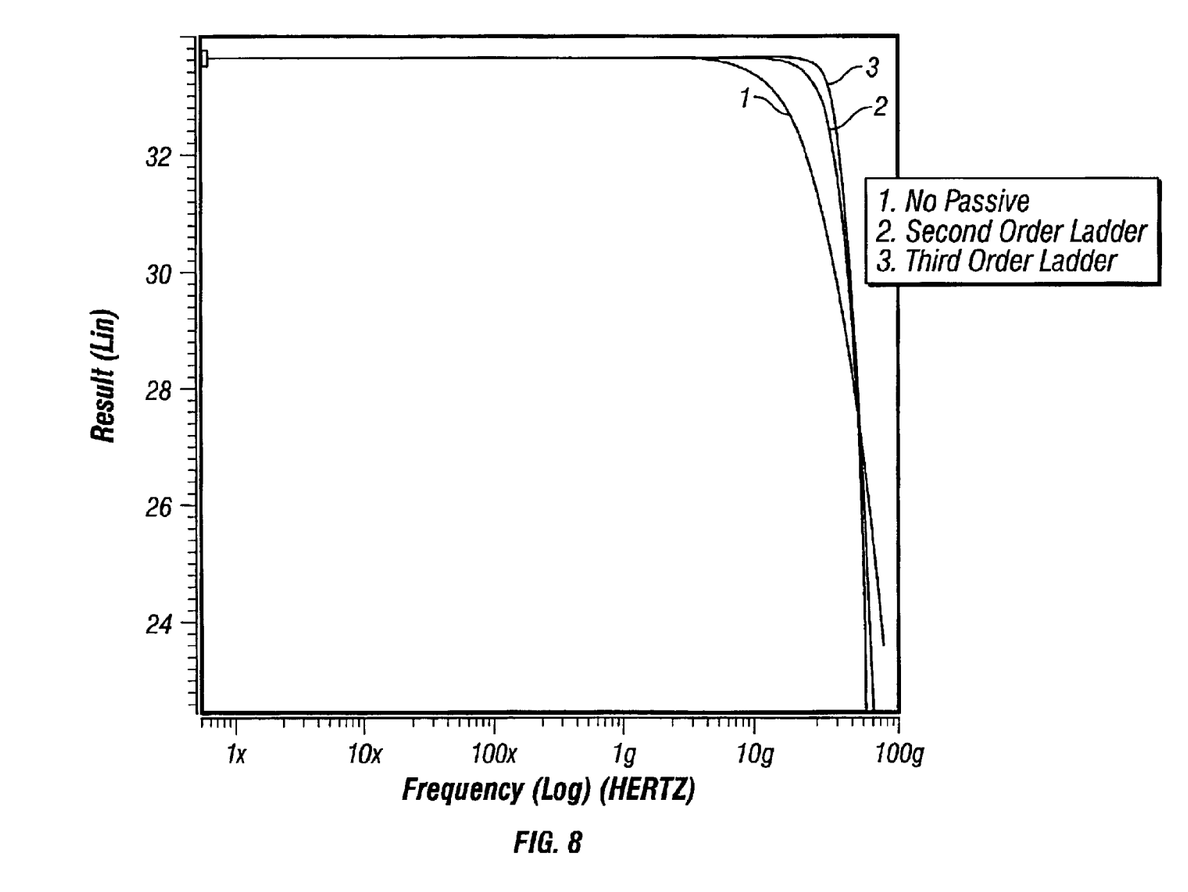
FIG. 8 is a graph of the output of a gain stage without any passive network as compared to the same stage with added $2^{nd}$ and $3^{rd}$ order Butterworth ladder structures.

The enhancement coefficient is graphed in FIG. 7 for different values of $R_1$. Here it is assumed that the stage is output stage, and $R_2$ is load resistance and equal to 50 Ω. Even for low order ladder structures 36, which are more practical to fabricate, the enhancement for a single stage is significant. To compare the low pass behavior with and without the passive structure, and moreover, the maintenance of a maximally flat response with adding the passives 22, the output of a gain stage as a function of frequency without any passive network 22 on line 1 is shown in FIG. 8, compared with the same stage having an added $2^{nd}$ and $3^{rd}$ order Butterworth ladder structure 36 as lines 2 and 3 respectively. The enhancement in the bandwidth is obvious.

Analysis of the input stage is a little different, especially when the desired case is a trans-impedance amplifier with a current input, e.g. in optical receivers where the photo diode is modeled as a current source and a capacitor in parallel. Here, $R_1$ is zero and the input is a current source model as diagrammatically shown in FIG. 4b. One way to analyze this case is to take $R_1$ as a parameter and find the value of $R_1$ that results in the maximum bandwidth. Then, remove $R_1$ from physical implementation. In ideal case, since all the rest of the passive structure 22 is working as a broadband match to $R_1$, removing it will not affect the bandwidth, however it will increase the total trans-impedance gain.

For example, it can be shown for a $3^{rd}$ order passive ladder network 36 at the input, with Butterworth behavior that the maximum bandwidth with maximally flat response is achieved when the components are designed for a value of $R_1=2.05R_2$, or $\delta=0.7$ assuming a fixed $C_1$ and $R_2$. This will result in a total input bandwidth enhancement of $$1.63 \times \left(1 + \frac{C_2}{C_1}\right),$$

which is a significant amount.

At last it should be noted again that this bandwidth-enhanced active low-pass stages can be cascaded or passive networks can be inserted between all the gain stages. If properly designed, this can result in a significant improvement in the bandwidth, as shown above in a circuit using this method with a total enhancement of 2.4 times the original bandwidth.

Figure 11:
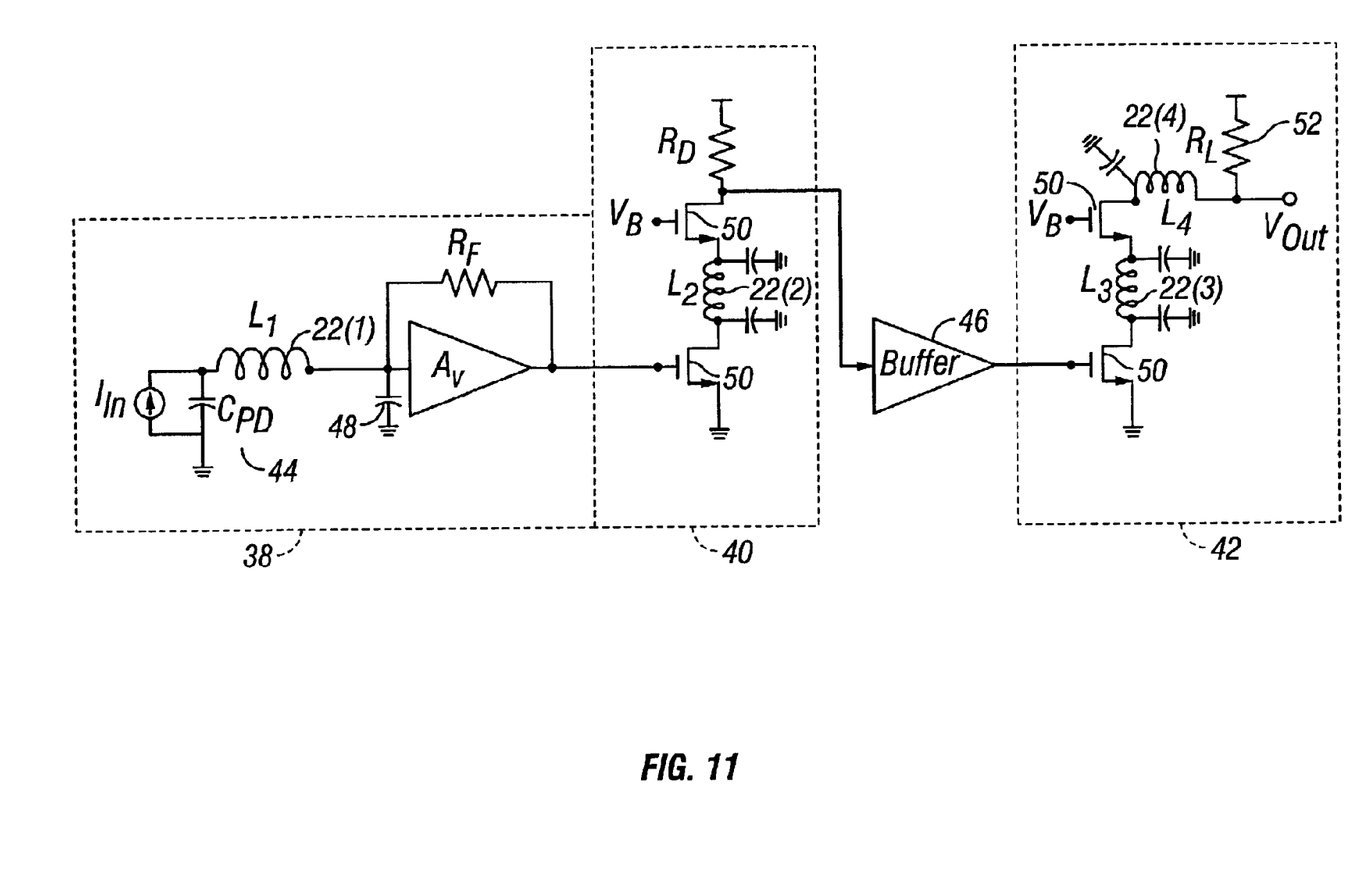
FIG. 11 is a schematic illustrating the insertion of a ladder structure between gain stages.

It is to be understood that different passive structures 22 can be inserted between gain stages 28 and 30. However, using a standard network configuration for which the component value equations are already known will simplify the design. A small-signal model of two cascaded gain stages 28 and 30 is shown in FIG. 11 after adding a standard ladder configuration 36. By choosing the desired frequency response shape and hence the filter type, the element values can be generated using standard network synthesis methods. The order of the passive network, n, is an additional design parameter as shown above. Using higher orders will improve the response. However, the components will then assume some impractical values and the number of inductors will also increase resulting in an unrealistic design. As an example, to achieve a maximally flat frequency response for a $3^{rd}$ order ladder network 36, such as the one in FIG. 11, values for the Butterworth filter components can be used as follows:

$$C_1 = \frac{1}{R_1(1-\delta)\omega_c} \tag{7}$$

$$L_2 = \frac{2}{(1-\delta+\delta^2)\omega_c^2 C_1} \tag{8}$$

$$C_3 = \frac{1}{R_2(1+\delta)\omega_c} \tag{9}$$

where δ is an indication of impedance transformation between $R_1$ and $R_2$ in the stages 28 and 30 respectively in FIG. 11 and is defined as:

$$\delta = \sqrt[n]{\frac{R_1 - R_2}{R_1 + R_2}} \qquad (10)$$

and $\omega_c$ is the 3-dB cut-off frequency of the network. Note that $C_1$ and $C_3$ are the transistor parasitic capacitances absorbed into the passive structure. The design approach is thus to first optimize the original amplifier with no additional components. As a result, component values for $R_1$, $R_2$, $C_1$, and $C_3$ will be known. Using either of equations (7) or (9), the new value for $\omega_c$ can be derived. Then, the value of the inductor can be calculated form equation (8), knowing all the other parameters. If the analysis is done for the output structure, $R_2$ should be replaced with $R_L$ which is the load resistance.

If we define the bandwidth enhancement ratio (BWER) as the ratio between the old (before adding any passive component) and new 3-dB bandwidth of the amplifier, we can show:

$$BWER = \frac{\omega_{c,new}}{\omega_{c,old}} = \frac{1}{1-\delta} \frac{R_2}{R_1 + R_2} \frac{C_1 + C_3}{C_1} \qquad (11)$$

This expression can be used as a guideline in designing the amplifier, before adding passive network 22. For instance, adjusting for larger $\delta$ with proper choice of load resistors will result in a better bandwidth enhancement ratio after inserting the network 22.

If the analysis is to be carried out for the input stage of a trans-impedance amplifier with a current input signal, $R_1$ is set at infinity due to the large equivalent resistance of the reverse biased photo diode. However, it can be shown from equation (11) that for fixed $C_1$, $C_2$, and $R_2$, there exists a value $R_1$ (i.e., resulting in $\delta=0.7$) that maximizes the BWER for the input stage. Therefore, the same approach can be used, without including $R_1$ in the network. The enhancement ratio in equation (11) should also be modified for the input passive structure 22 as:

$$BWER = \frac{\omega_{c,new}}{\omega_{c,old}} = \frac{1}{1-\delta} \frac{R_2}{R_1} \frac{C_1 + C_3}{C_1} \qquad (12)$$

To demonstrate the effectiveness of the methodology of the invention, the design of a CMOS trans-impedance amplifier (TIA) is now described. The simplified schematic of the circuit including the added passive components is shown in FIG. 6. It is a single-ended design comprised of three gain stages 38, 40 and 42. The first stage 38 is a shunt—shunt feedback transimpedance stage that provides a low input impedance. This will reduce the dominant effect of the input pole due to the large photo diode junction capacitance 44 ($C_{PD}$). The next two stages 40 and 42 are in cascode configuration and are isolated using a source follower buffer 46. Four passive networks are inserted in the critical nodes of the circuit of FIG. 6 to relocate the poles and therefore, enhance the bandwidth. The input network 22(1), separates the photo diode capacitance 44 and the parasitic capacitance 48 of input stage 38. Adding one inductor will turn it into a $3^{rd}$ order ladder structure 36, which can be designed as explained in the previous section. The next two networks 22(2) and 22(3) are also of $3^{rd}$ order and are placed between the cascoded transistors 50. The output network 22(4) isolates the load resistance 52 from the last stage 42 and is a $2^{nd}$ order network. However, adding explicit capacitors (including bonding pad capacitance) can turn it into a $3^{rd}$ order structure 22. With this choice of networks, only inductors need to be added to the circuit of FIG. 6. The capacitors as shown in dotted line in FIG. 6 are the parasitics from the devices.

A final optimization is done to include the bilateral effects. Note that the output network 22(4) is different from a conventional shunt-peaking approach. For a photo diode capacitance of 0.5 pF, the circuit of FIG. 6 achieves over 9 GHz bandwidth. This is 2.4 times larger than the bandwidth achieved using same circuit with no additional passives.

Figure 12:
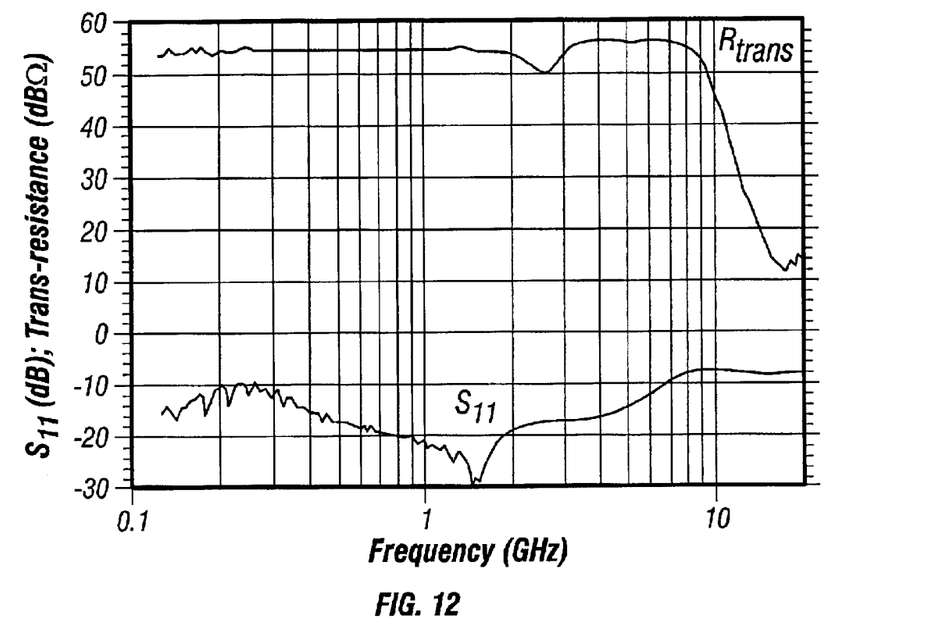
FIG. 12 is a graph of the transresistance gain of the transimpedance amplifier of FIG. 6 with a 0.5 pF photo diode capacitance and input rectification on the same graph.
Figure 13:
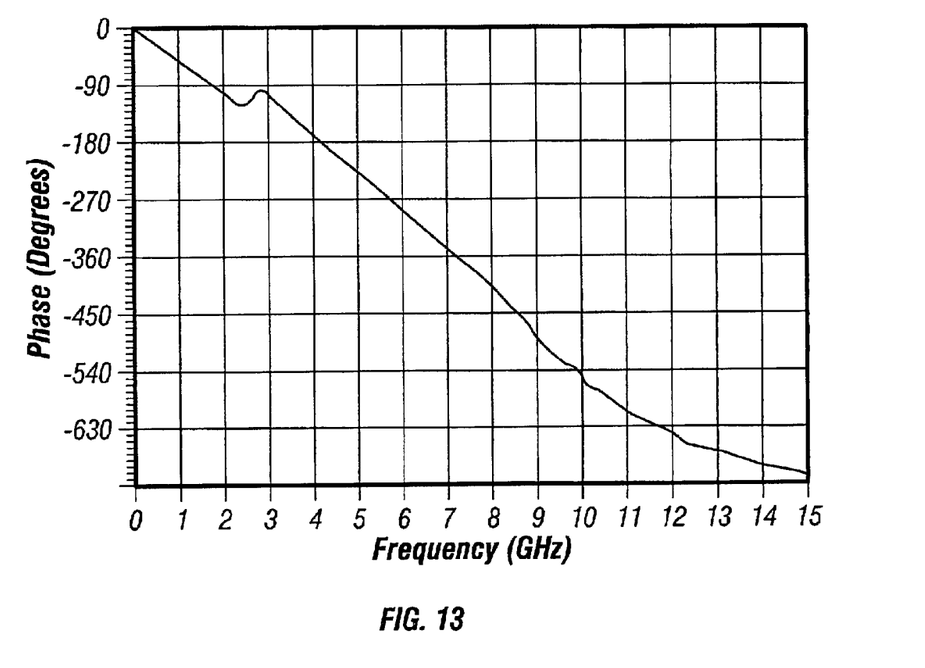
FIG. 13 is a graph of the phase response of the transimpedance amplifier of FIG. 6.
Figure 14:
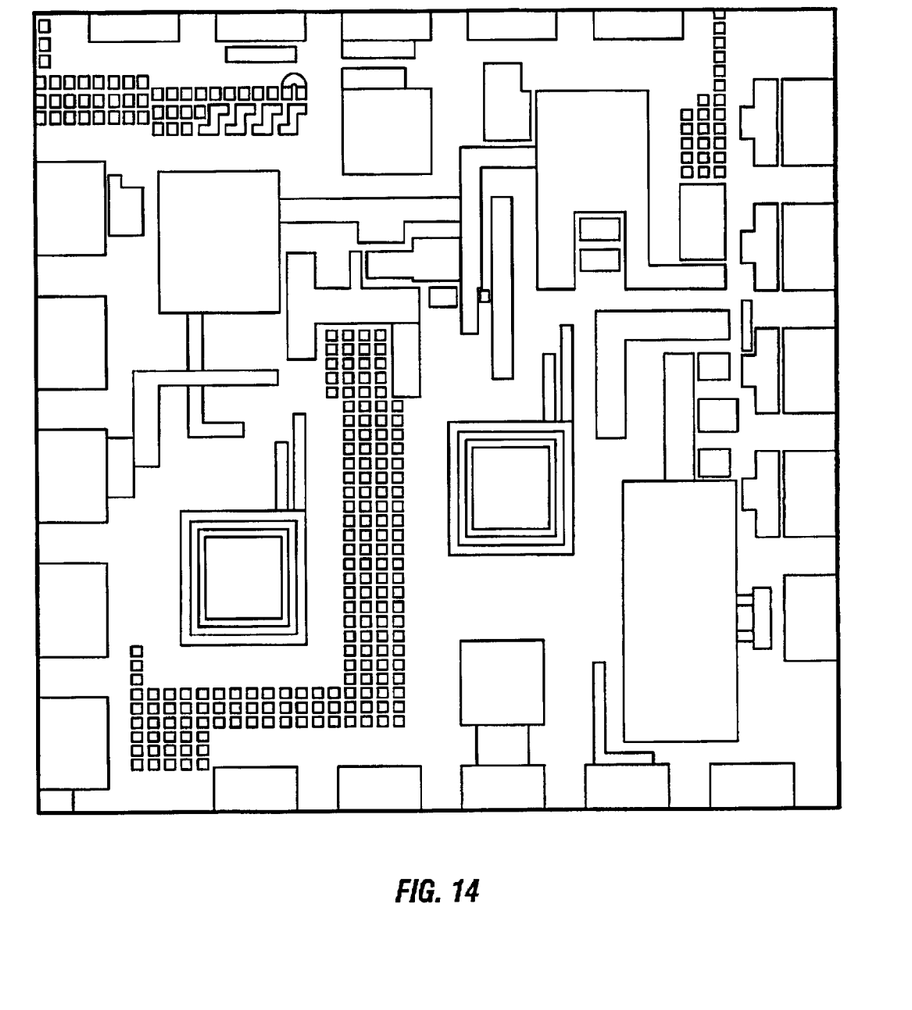
FIG. 14 is a die photograph of a 9.2 GHz transimpedance amplifier devised according to the invention.

A trans-impedance amplifier was implemented in an illustrated embodiment using 0.18 $\mu$m MOS transistors in a BiCMOS process technology. It draws 55 mA from a 2.5V power supply. The amplitude and phase response of the implemented transimpedance amplifier, extracted from measurement data are shown as a function of frequency in the graphs of FIG. 12 and FIG. 13 respectively. Here, the photo-detector capacitance is $C_{PD}$=0.5 pF. The bandwidth is 9.2 GHz and the transimpedance gain is 54 dB. This is the fastest 0.18 $\mu$m CMOS transimpedance amplifier known to this date. The input reflection coefficient, $S_{11}$, remains below −10 dB up to 7 GHz. The dip in the frequency response of the transimpedance can be traced back to a resonance mode between the on-chip supply bypass capacitor and wirebond and supply line inductances, as changing those parameters directly affects its depth and frequency. Simulated average equivalent input noise current is 17 pA/√Hz. This results in total input noise current of 1.6 $\mu$A. The amplifier core occupies 0.8×0.8 mm$^2$ of area, as shown in the microphotograph of FIG. 14.

Thus in summary it can be understood that the invention addresses the gain-bandwidth (GBW) limitation problem and introduces a new practical methodology that can be used to design wideband amplifiers with specified characteristics for its transfer function. In a simple design procedure, parasitic capacitances of transistors can be absorbed into passive networks 22, and inserted between the gain stages. The component values can be calculated based on standard low-pass filter structures. A prototype CMOS transimpedance amplifier implemented using the developed technique achieves over 9 GHz bandwidth and 54 dB transimpedance gain from a 0.5 pF photo-diode capacitance.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An amplifier comprising:
    a plurality of gain stages, each of the gain stages having at least a parasitic capacitance associated therewith and characterized by a corresponding transfer function; and
    at least one passive network, having a circuit topology characterized by component values, coupled between two of the gain stages, or input or output of, one stage, such that the parasitic capacitance associated with at least one of the gain stages is included as part of the circuit topology of the network, the network having the component values chosen to provide the transfer function of the one gain stage with an enhanced bandwidth as compared to the transfer function of the one gain stage as limited by the parasitic capacitance associated therewith, the enhanced bandwidth provided by absorbing the parasitic capacitance associated with the gain stage into the circuit topology so that the gain stage has infinite bandwidth and so that frequency dependent performance of the amplifier relies substantially only on the passive network with low sensitivity to component values thereby providing a frequency dependent transfer function which does not take the form of an impedance transfer function and is not Bode-Fano limited.

2. The amplifier of claim 1 further comprising a plurality of networks, one of the plurality of networks being coupled between each of the gain stages.

3. The amplifier of claim 1 wherein each gain stage has an input parasitic capacitance and an output parasitic capacitance and where the one network incorporates the output parasitic capacitance of a leading one of the two gain stages into its circuit topology and incorporates the input parasitic capacitance of a following one of the two gain stages into its circuit topology.

4. The amplifier of claim 1 wherein the network comprises a passive network.

5. The amplifier of claim 1 wherein the network comprises a low pass filter.

6. The amplifier of claim 1 wherein the network comprises a passive low pass filter.

7. The amplifier of claim 1 wherein the amplifier is characterized by a gain bandwidth product and wherein the component values are chosen such that the gain bandwidth product of the amplifier is not subject to the Bode-Fano limit.

8. The amplifier of claim 1 wherein the network comprises a third order ladder network.

9. An amplifier comprising:
    a plurality of gain stages, each of the gain stages having at least a parasitic capacitance associated therewith and characterized by a corresponding transfer function; and
    at least one network, having a circuit topology characterized by component values, coupled between two of the gain stages, or input or output of one stage, such that the parasitic capacitance associated with at least one of the gain stages is included as part of the circuit topology, the network having the component values chosen to provide the transfer function of the one gain stage with an enhanced bandwidth as compared to the transfer function of the one gain stage as limited by the parasitic capacitance associated therewith,
    wherein each gain stage has an input parasitic capacitance and an output parasitic capacitance and where the one network incorporates the output parasitic capacitance of a leading one of the two gain stages into its circuit topology and incorporates the input parasitic capacitance of a following one of the two gain stages into its circuit topology,
    wherein the network comprises a third order ladder network and the two gain stages are characterized by an enhanced bandwidth ratio, BWER, given by $$BWER = \frac{\omega_{c,new}}{\omega_{c,old}} = \frac{1}{1-\delta}\frac{R_2}{R_1+R_2}\frac{C_1+C_3}{C_1} \text{ where } \delta = \sqrt[3]{\frac{R_1-R_2}{R_1+R_2}}$$

where $C_1$ is the output parasitic capacitance of the leading gain stage, $C_3$ is the input parasitic capacitance of the following gain stage, $R_1$ is the output resistance of the leading gain stage, and $R_2$ is the input resistance of the following gain stage.

10. An amplifier comprising:
    a plurality of gain stages, each of the gain stages having at least a parasitic capacitance associated therewith and characterized by a corresponding transfer function; and
    at least one network, having a circuit topology characterized by component values, coupled between two of the gain stages, or input or output of one stage, such that the parasitic capacitance associated with at least one of the gain stages is included as part of the circuit topology, the network having the component values chosen to provide the transfer function of the one gain stage with an enhanced bandwidth as compared to the transfer function of the one gain stage as limited by the parasitic capacitance associated therewith,
    wherein the network comprises a third order ladder network having an input source, and at the input of one of the plurality of gain stages which is a transimpedance amplifier stage, the gain stage is characterized by an enhanced bandwidth ratio, BWER, given by $$BWER = \frac{\omega_{c,new}}{\omega_{c,old}} = \frac{1}{1-\delta} \frac{R_2}{R_1} \frac{C_1 + C_3}{C_1} \text{ where } \delta = \sqrt[3]{\frac{R_1 - R_2}{R_1 + R_2}}$$

where $C_1$ is the parasitic capacitance of the input source, $C_3$ is the input parasitic capacitance of the gain stage, $R_1 = 2.05 R_2$, and $R_2$ is the input resistance of the gain stage.

11. A method of amplifying a signal comprising:
   amplifying the signal in a plurality of gain stages, each of the gain stages having a parasitic capacitance associated therewith and characterized by a corresponding transfer function; and
   conditioning the amplified signal between the gain stages such that the parasitic capacitance associated with at least one of the gain stages is included as part of the transfer function of the gain stages to result in an enhanced bandwidth of the gain stages as compared to the gain stages as limited by the parasitic capacitance associated therewith without signal conditioning, the enhanced bandwidth being provided by absorbing the parasitic capacitance associated with the gain stage into the circuit topology so that the gain stage has infinite bandwidth and so that frequency dependent performance of the amplifier relies substantially only on the passive network with low sensitivity to component values thereby providing a frequency dependent transfer function which does not take the form of an impedance transfer function and is not Bode-Fano limited.

12. The method of claim 11 further comprising conditioning the amplified signal between the gain stages, at the input of an input stage or the output of an output stage, such that the parasitic capacitance associated with all of the gain stages is included as part of the transfer function of the gain stages.

13. The method of claim 11 wherein conditioning the amplified signal between the gain stages, at the input of an input stage or the output of an output stage, comprises conditioning the amplified signal between each of the gain stages with a corresponding network which incorporates the parasitic capacitances into its circuit topology.

14. The method of claim 13 wherein conditioning the amplified signal between each of the gain stages, at the input of an input stage or the output of an output stage, with a corresponding network between each of the gain stages with a corresponding network comprises conditioning the amplified signal with passive network with any order.

15. The method of claim 13 wherein conditioning the amplified signal between each of the gain stages, at the input of an input stage or the output of an output stage, with a corresponding network between each of the gain stages comprises conditioning the amplified signal with a low pass filter of any order.

16. The method of claim 13 wherein conditioning the amplified signal between each of the gain stages, at the input of an input stage or the output of an output stage, with a corresponding network between each of the gain stages comprises conditioning the amplified signal with a ladder network of any order.

17. A method of amplifying a signal comprising:
   amplifying the signal in a plurality of gain stages, each of the gain stages having a parasitic capacitance associated therewith and characterized by a corresponding transfer function; and
   conditioning the amplified signal between the gain stages such that the parasitic capacitance associated with at least one of the gain stages is included as part of the transfer function of the gain stages to result in an enhanced bandwidth of the gain stages as compared to the gain stages as limited by the parasitic capacitance associated therewith without signal conditioning,
   wherein conditioning the amplified signal between the gain stages, at the input of an input stage or the output of an output stage, comprises conditioning the amplified signal between each of the gain stages with a corresponding network which incorporates the parasitic capacitances into its circuit topology,
   wherein the network comprises a third order ladder network and wherein conditioning the amplified signal between the gain stages results in an enhanced bandwidth ratio, BWER, given by $$BWER = \frac{\omega_{c,new}}{\omega_{c,old}} = \frac{1}{1-\delta} \frac{R_2}{R_1 + R_2} \frac{C_1 + C_3}{C_1} \text{ where } \delta = \sqrt[3]{\frac{R_1 - R_2}{R_1 + R_2}}$$

where $C_1$ is the output parasitic capacitance of a leading gain stage, $C_3$ is the input parasitic capacitance of a following gain stage, $R_1$ is the output resistance of the leading gain stage, and $R_2$ is the input resistance of the following gain stage.

18. A method of amplifying a signal comprising:
   amplifying the signal in a plurality of gain stages, each of the gain stages having a parasitic capacitance associated therewith and characterized by a corresponding transfer function; and
   conditioning the amplified signal between the gain stages such that the parasitic capacitance associated with at least one of the gain stages is included as part of the transfer function of the gain stages to result in an enhanced bandwidth of the gain stages as compared to the gain stages as limited by the parasitic capacitance associated therewith without signal conditioning,
   wherein conditioning the amplified signal between the gain stages, at the input of an input stage or the output of an output stage, comprises conditioning the amplified signal between each of the gain stages with a corresponding network which incorporates the parasitic capacitances into its circuit topology,
   wherein the network having an input source comprises a third order ladder network, wherein the input gain stage is a transimpedance amplifier stage, and wherein conditioning the amplified signal between the input and output gain stage results in an enhanced bandwidth ratio, BWER, given by $$BWER = \frac{\omega_{c,new}}{\omega_{c,old}} = \frac{1}{1-\delta} \frac{R_2}{R_1} \frac{C_1 + C_3}{C_1} \text{ where } \delta = \sqrt[3]{\frac{R_1 - R_2}{R_1 + R_2}}$$

where $C_1$ is the parasitic capacitance of the input source, $C_3$ is the input parasitic capacitance of the input gain stage, $R_1 = 2.05 R_2$, and $R_2$ is the input resistance of the following gain stage.

19. A method of amplifying a signal in an amplifier of multiple gain stages having parasitic capacitances comprising:
   amplifying the signal in the amplifier which has been designed for optimized bandwidth performance as determined by amplifier parasitic capacitances and resistances without having any additional signal conditioning performed between gain stages of the amplifier; and conditioning the signal between the gain stages of the amplifier using a network with a determined inductance, a new cutoff frequency for the amplifier being determined to obtain a maximally flat frequency response when using the network coupled between the gain stages, which network incorporates the parasitic capacitances and resistances of the optimized amplifier into its circuit topology, the determined inductance required by the network being determined from the new cutoff frequency, the enhanced bandwidth being provided by absorbing the parasitic capacitance associated with the gain stage into the circuit topology so that the gain stage has infinite bandwidth and so that frequency dependent performance of the amplifier relies substantially only on the passive network with low sensitivity to component values thereby providing a frequency dependent transfer function which does not take the form of an impedance transfer function and is not Bode-Fano limited.

20. A method of amplifying a signal with multiple gain stages comprising the steps of: inserting passive networks in between the gain stages, at the input of the input gain stage, at the output gain stage, or a combination thereof; and selecting the components of the inserted passive network, based on the values of the parasitic components of the gain stages, which parasitic components are incorporated as part of the components of the passive network, to achieve an enhanced transfer function in terms of an electrical measure of merit, including but not limited to bandwidth or phase, the enhanced transfer function being provided by absorbing the parasitic capacitance associated with the gain stage into the circuit topology so that the gain stage has infinite bandwidth and so that frequency dependent performance of the amplifier relies substantially only on the passive network with low sensitivity to component values thereby providing a frequency dependent transfer function which does not take the form of an impedance transfer function and is not Bode-Fano limited.

* * * * *